United States Patent [19]

Economy et al.

[11] 3,951,870

[45] Apr. 20, 1976

[54] SUPERCONDUCTIVE TRANSITION METAL CARBONITRIDE FIBERS AND METHOD FOR THE PREPARATION THEREOF

[75] Inventors: James Economy, Eggertsville; John H. Mason, Clarence; William D. Smith, Tonawanda, all of N.Y.

[73] Assignee: The Carborundum Company, Niagara Falls, N.Y.

[22] Filed: Sept. 13, 1973

[21] Appl. No.: 396,926

[52] U.S. Cl. .............................. 252/506; 29/599; 252/516; 423/364; 423/371
[51] Int. Cl.$^2$............................................ H01B 1/06
[58] Field of Search ............ 252/506, 516; 423/364, 423/371; 29/599; 75/174

[56] References Cited
UNITED STATES PATENTS

| | | | |
|---|---|---|---|
| 3,364,099 | 1/1968 | Forshey et al. ................. | 252/516 X |
| 3,380,935 | 4/1968 | Ring .............................. | 252/511 X |

OTHER PUBLICATIONS

"Superconductivity of Cubic Niobium Carbo–Nitrides", J. Phys. Chem. Solids, Pergamon Press 1967, Vol. 28, pp. 333–341.

Chemical Abstracts, Vol. 78, 1973, 7260d, "Development on Process for Producing Continuous Fine Diameter Filaments of Superconductors".

*Primary Examiner*—Leland A. Sebastian
*Assistant Examiner*—E. Suzanne Parr
*Attorney, Agent, or Firm*—David E. Dougherty; Raymond W. Green; Herbert W. Mylius

[57] ABSTRACT

Fine diameter continuous multifilament superconductor yarns comprising niobium carbonitride may be prepared. The fibers of which the yarn is composed possess a very high transition temperature ($T_c$ of 17°K) combined with a good upper critical field ($H_{c2}$ of 125 kG) and critical current density ($J_c$ of $10^5$ amps/cm$^2$ at 40 kG). This invention provides excellent superconductor materials in the form of continuous fine diameter multifilament yarn.

9 Claims, No Drawings

SUPERCONDUCTIVE TRANSITION METAL CARBONITRIDE FIBERS AND METHOD FOR THE PREPARATION THEREOF

BACKGROUND OF THE INVENTION

This invention relates to superconducting compositions, and a method for the preparation thereof. More specifically, this invention is related to superconducting fibers of niobium carbonitride.

It is well known that certain metals, alloys, and compounds go through a superconducting transition into a state in which the electrical resistance has a value approximately 0 at temperatures approaching absolute zero. The temperature at which such a material becomes superconducting is referred to as the transition temperature, $T_c$. When a superconductive material is subjected to a magnetic field, a current will flow as long as the temperature of the material remains below the transition temperature, $T_c$, and the magnetic field is below a critical level, $H_{c2}$. This critical field is a function of temperature, increasing as temperature is reduced below $T_c$.

It is desirable that $H_{c2}$ be as high as possible, just as it is desirable that $T_c$ be high. For example, in the production of superconductive magnetic coils, a superconductive material is desired which will provide a high critical field. When such a coil is in use, the field to which the coil is subjected must remain below the specified $H_{c2}$ of the superconductive material.

The first superconducting coils that were built used wire consisting only of superconducting material. It was found, however, that the performance of such coils was seriously degraded by unpredictable premature transition of the superconductor to the normal (non-superconducting) state. In order to overcome this problem, various forms of composite electrical superconductive materials have been used. These composite conductors comprise a superconductor in intimate contact throughout its length with a normal conductor of high conductivity, the normal conductor acting as a shunt when a transient instability causes a portion of the superconductor to become non-superconductive. When the transient has ended, the current returns to the superconducting portion. The normal conductor utilized is ordinarily copper or aluminum. An example of such a method is demonstrated by U.S. Pat. No. 3,594,226, to Thomas. This patent describes a composite electrical conductor comprising a carbon fiber coated with a superconductor, such as niobium/tin ($Nb_3Sn$). The superconductor coating is applied by vapor deposition. Such fibers may be utilized to form a yarn or cable. A more recent description of a composite superconductive body is given by U.S. Pat. No. 3,748,728, of Watson. This reference teaches a porous glass matrix having a granular system of superconductive material disposed within the pores thereof. Adjacent grains of superconductive material are spacially separated, but are electrically connected by electron tunneling. The superconductive material is forced into the pores of the matrix under high pressure. Another composite superconducting structure is taught in U.S. Pat. No. 3,380,935, to Ring. This patent teaches a metal and/or polymer matrix and a superconductor material, in amounts of 20–90 percent by volume of structure, which is in discontinuous fiber form. Another superconducting composite material is disclosed in U.S. Pat. No. 3,447,913, to Yntema. This composite material includes a superconductive matrix in which is embedded solid discrete particles of a non-superconducting, non-conducting material.

Much emphasis in the field of superconductivity has been placed in finding materials with high transition temperature ($T_c$), high upper critical field ($H_{c2}$) and high current density ($J_c$). The areas of research have included transition metal refractory materials, many of which have been found to possess excellent superconducting properties. Exemplary of such materials are transition metal carbides and nitrides, such as niobium carbide and nitride. U.S. Pat. No. 3,364,099, to Forshey et al, relates to superconducting niobium carbide and nitride products in the shape of fibers, films, and plates. The fibrous niobium carbide of said patent exhibits a significantly higher transition temperature than previously reported bulk niobium carbide. Bulk niobium carbide has been reported as exhibiting a transition temperature no higher than 11.1°K, whereas fibrous niobium carbide was found to exhibit transition temperature as unexpectedly high as 17.3°K. Similarly, fibrous niobium nitride thus prepared exhibited a transition temperature of 17°K as compared with reported transition temperatures of approximately 15°K. This reference also teaches the preparation of fibrous materials containing mixed niobium carbide/nitride crystals. Another teaching of carbide fibers may be found in Wainer et al, U.S. Pat. No. 3,269,802. This reference teaches the preparation of niobium carbide by a reaction of niobium pentachloride with carbonized rayon cloth at elevated temperatures. Dry hydrogen carrier gas is utilized in the formation of the niobium carbide.

The preparation of carbonitride materials per se has been known for some time. For example, Beatty et al, U.S. Pat. No. 3,577,485, teaches the conversion of actinide oxide-carbon particles to actinide carbonitride by contacting the actinide oxide-carbon particles with nitrogen in a fluidized bed furnace at elevated temperatures. A single phase material may be formed by removal of free carbon.

SUMMARY OF THE INVENTION

The superconducting properties of niobium carbonitride have been known for many years; however, because of its brittle character, niobium carbonitride could be prepared only as a sputtered coating or in the form of a sintered body. The development of a continuous niobium carbonitride fiber with good strength and flexibility presents a new and eminently useful form of superconductive material. Recently there has been much interest in producing multifilament superconductors having very small fiber diameters, such as 20 microns and less. Such materials would theoretically help to overcome the problem of flux jump instability which now occurs in superconductive magnet windings. Further, such fibers would also be useful for AC power transmission because of the fine diameters, since AC power losses decrease as fiber diameter decreases.

The present invention provides a method by which transition metal carbonitrides can be made in continuous multifilament yarn, with fiber diameters of from 4–12 microns. These fibers are prepared by the chemical conversion of a precursor carbon fiber, by the high temperature reaction of the carbon yarn with a transition metal such as $NbCl_5$, $H_2$, and $N_2$.

The atomic ratio of carbon to nitrogen in niobium carbonitride, $NbC_xN_{1-x}$, is maintained within the range of $x=0.1–0.3$, to achieve optimum superconducting properties. The individual filament diameter is maintained at about 7 microns, although fibers with diameters as low as 4–5 microns may be prepared. Such fibers have excellent mechanical properties, as well as good flexibility. Individual filaments routinely display tensile strengths in the range of 70–100 ×10³ lbs/sq. in. Such filaments may be coated with a matrix of either high or low electrical conductivity, depending on end use. Coatings of copper and nickel are suitably deposited uniformly on the niobium carbonitride filaments in the yarn form.

The superconducting fibers of the present invention are prepared by the conversion of high carbon content yarns, strands, or related filamentary materials to carbonitride, by the exposure of the precursor filaments to the halide of a transition metal selected from the group consisting of titanium (Ti), niobium (Nb), zirconium (Zr), tantalum (Ta), and hafnium (Hf). In accordance with the process of the present invention, a fiber having a maximum diameter of about 20 microns, and consisting essentially of carbon, is heated at a temperature of at least about 1200°C, in a gaseous atmosphere consisting essentially of nitrogen, hydrogen, and a halide of a transition metal. An inert gas, such as argon may also be present. Preferably, the transition metal halide is selected from the group consisting of titanium tetrachloride, niobium pentachloride, zirconium tetrachloride, tantalum pentachloride, and hafnium tetrachloride. As a result of such heating, for a sufficient time in the prescribed atmosphere, a complex reaction occurs, and there is produced a refractory fiber having a larger diameter than the starting carbon fiber, and consisting essentially of the carbonitride of the transition metal whose halide was employed. It is believed that the reaction takes the following form:

I. $NbCl_5 + C + N_2 + H_2 \rightarrow NbCN + HCl$

In the presence of excess carbon, the product obtained may be a mixture of niobium carbide and niobium carbonitride. In the presence of excess nitrogen, the product obtained is apparently a mixture of niobium carbonitride and niobium nitride. It is also noted that under certain operating conditions, the fiber produced may take the form of a carbon core surrounded by a solid solution of niobium nitride in niobium carbide. Niobium carbonitride has been described as a solid solution of niobium carbide and niobium nitride, each of which is completely soluble in the other throughout the entire range of concentrations.

DESCRIPTION OF PREFERRED EMBODIMENTS

The starting material may be an individual filament such as a thread of carbonized material, or it may be a fiber wound from individual filaments or strands of carbon, or it may be an aggregate of individual carbonized filaments in which the filaments are randomly oriented. Such fibers or filaments may be carbonized by known procedures. Any of a number of procedures may be followed in this portion of the process without departing from the intended scope of the invention. Known procedures usually involve heating carbonizable material at elevated temperatures in non-oxidizing atmospheres to distill off volatiles and degrade or decompose the organic material into a carbonaceous or graphitized form.

The process of the present invention may be conducted in either a batch-wise method or in a continuous furnace environment. Normally, a conventional tube furnace is employed, comprising a horizontal, cylindrical mullite tube having an inner diameter of about 4 cm, the middle or "hot zone" of which may be heated by external electrical resistance heating elements which are disposed parallel to the longitudinal access to the tube. Provision is also made for the admission of gaseous transition metal halide, hydrogen, and nitrogen. A carrier gas, such as nitrogen or argon, is provided for the niobium pentachloride.

EXAMPLE 1

A single ply carbon yarn of 720 filaments, each filament being approximately 10 microns in diameter, is reacted as follows. At a temperature of 1400°C, within a hot zone 6 inches long, the carbon yarn is held statically, while $NbCl_5$, $H_2$, $N_2$, and Ar are passed through. About 200 g of $NbCl_5$ is heated to 200°C while a carrier of gas flow rate of 60 cc/min. of argon is passed over the surface of the $NbCl_5$. The flow rates of the reactive gasses are: 100 cc/min. of $H_2$; and 400 cc/min. of $N_2$. An additional flow rate of 100 cc/min. of argon is also provided for dilution. After a reaction time of 10 minutes, a yarn is produced that has a density of 4.5 g/cc. and consists of $NbC_{.94}$ and $NbC_{.18}N_{.82}$. This yarn has a transition temperature of 17.2 K.

EXAMPLE 2

A carbon yarn such as used in Example 1 is reacted in the same furnace and under the same reaction conditions set forth in Example 1, except that it is reacted in a continuous manner. At a passage rate of 0.5 in/min. of yarn through the 6-inch hot zone (12 minutes reaction time), the yarn produced has a density of 5.3 g/cc. and is composed of $NbC_{.91}$ and $NbC_{.13}N_{.87}$.

EXAMPLE 3

A carbon yarn such as used in Example 1 is reacted statically at 1500°C for 20 minutes. Gas flows are the same as in Examples 1 and 2. After 20 minutes the yarn is removed from the furnace and found to have a density of about 7.9±.2 g/cc. and a composition of $NbC_{.70}N_{.30}$ and $NbN_x$. These examples demonstrate the effect of variations in reaction time and temperature, with increased temperature and reaction time yielding higher conversion.

It has been found that temperatures in excess of 1200°C are suitable for the reaction of this method. Increasing the temperature tends to increase the rate of reaction, and temperatures of 1800°C or higher may be used if desired. The preferred temperatures are from about 1300°C to about 1600°C. Reaction times are inversely related to the reaction temperature, and may vary from about 10 minutes to 20 minutes or longer. The degree of conversion is thus dependent upon the concentration of $NbCl_5$, temperature, and time. However, to form a flexible fiber, a high temperature is advantageous, since it increases reaction rate, thus eliminating fusion of individual fibers, reducing reaction time, and increasing conversion.

As demonstrated by the above examples, it is possible to vary the composition of the niobium carbonitride within relatively broad limits. Thus, the compositions of the niobium carbonitride produced by this invention may be designated as $NbC_xN_{1-x}$. The variance in the composition may be described in terms of the variable x. According to the criteria utilized to determine the composition desired, x may vary from .05 to .75. The composition range to maximize each of the properties $T_c$ and $H_{c2}$ is given below:

TABLE I

| CRITERIA | COMPOSITION RANGE |
|---|---|
| Optimum $T_c$ | $NbC_{.15}N_{.85}$ to $NbC_{.50}N_{.50}$ |
| Optimum $H_{c2}$ | $NbC_{.10}N_{.90}$ to $NbC_{.30}N_{.70}$ |

The optimum $J_c$ is dependent upon "pinning mechanisms", rather than composition per se. Pinning centers may be introduced by such methods as the addition of a non-superconducting phase, heat treatment to form a precipitate, and cold working to introduce strain into the material.

Various ranges of the ratio of carbon to nitrogen and the effects that varying of this range has upon $T_c$ and $H_{c2}$, are well known, relative to $NbC_xN_{1-x}$ in bulk form. Similar results are observed with the fibrous $NbC_xN_{1-x}$ of this invention.

The degree of conversion of carbon into carbonitride phase is dependent upon the amount of niobium metal available. Too much niobium deposition on the carbon filament usually causes fusion and yields a brittle fiber bunder. On the other hand, inadequate niobium will result in a fiber with a low degree of conversion. Similarly, the presence of excess carbon or nitrogen have been found to effect the reaction in the following fashion:

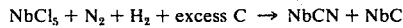

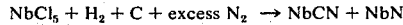

The reaction product of the present invention is believed to comprise a solid solution (NbCN) plus a separate phase of either NbC or NbN, dependent upon operating conditions.

The superconductive filament provided by the above-described techniques may be coated by both insulative or conductive coating. Suitable materials include: polyvinyl formal resins such as Formvar (tm) resins, copper, copper-nickel, a suspension of lead or copper in an epoxy, woods metal, and nickel. Such coatings as copper and nickel may be applied by electroless coating deposition techniques. Suitable alternative techniques include electrolytic deposition, dipping, painting, and spraying.

Since the superconductivity of the fibers is governed by many factors, including composition, impurities, morphology, and crystal structure, it is clear that care must be taken in the selection of the reactant materials for use in this invention. To obtain the maximum benefit from the teachings of this invention, it has been found desirable to correlate the reaction parameters; e.g., the temperature and pressure of the reaction zone and the relative amounts of the halide, hydrogen and nitrogen being reacted, so that there is no plating of the niobium upon the filament, or any bridging of the individual fibers of the yarn by deposited niobium. Rather, the reaction environment is preferably so controlled that a maximum amount of the carbon in a yarn or filament is converted to the carbonitride.

The niobium carbonitride of this invention is highly flexible, but exhibits high tensile strength. These new fibrous products generally exhibit a diameter on minimum cross section of less than 20 microns, and also possess flexibility at diameters such as five microns sufficient to permit bending of such fibrous product around a one-inch mandrel without breaking. These fibers exhibit extremely good thermal stability, inertness, and strength. Mats or felts of the fiber are readily obtained by suspension of the fiber in a viscous liquid, followed by filtration to remove the dispersing liquid. These new superconducting fibers are useful in numerous areas, such as rotating machinery, AC transmission, magnets, and energy storage. The availability of such filaments makes possible the design of larger and more powerful superconducting motors and generators. The higher transition temperature of these materials will permit a much higher operating temperature than can be used with niobium titanium ($T_c$=9.5°K) which is currently the only commercially available filamentary material. For example, with the niobium carbonitride continuous filament superconductor, operating temperatures may be raised from 4.2°K to about 12°K. This greatly reduces the cost of refrigeration, or operations may be conducted at lower temperatures, with higher performance.

The very fine diameter of the filaments, from 4–7 microns for example, tends to greatly reduce problems arising from flux jumps. In fact, the filament is very close to being inherently stable, which means heat may be dissipated with minimal stabilization with a matrix such as copper. It is noted that the resistivity of the matrix of a continuous multifilament yarn of niobium carbonitride may be tailored for use in harsh alternating current environments. For example, individual filaments of niobium carbonitride may be first coated with a metal and then electrically isolated in a higher resistivity matrix. Thusly, any losses are greatly minimized.

In the case of magnetic usage, there has been a constant search for materials which combine high performance with improved reliability. Traditionally, niobium titanium wire has been used because of its good mechanical properties and ease of handling. However, the low $T_c$ of niobium titanium necessitates large amounts of copper for stabilization, which in turn imposes a severe limitation upon achieving higher performance. The high $T_c$ of niobium carbonitride yarn sharply reduces the need for large amounts of copper, since larger temperature variations may be more readily tolerated. Use of a superconducting magnet as an energy storage device presents another area where niobium carbonitride filaments provide a significant advantage. This application requires that the magnet withstand large rapid changes in magnetic field. As previously indicated, the large losses conventionally associated with this type of use can be greatly reduced by isolating the individual filaments of niobium carbonitride superconducting yarn in a non-conducting matrix.

Percentages referred to herein are percentages by weight except as otherwise expressly stated or clearly indicated by the context. While the invention has been described herein with reference to certain examples and preferred embodiments, it is to be understood that various changes and modifications may be made by those skilled in the art without departing from the concept of the invention, the scope of which is to be determined by reference to the appended claims.

We claim:

1. A superconducting fiber comprising niobium carbonitride having a maximum diameter of 20 microns wherein said niobium carbonitride has a formula $NbC_xN_{1-x}$ wherein x is from about 0.05 to about 0.75.

2. A filamentary superconductor having a maximum diameter of 20 microns comprising a mixture of niobium carbonitride and a compound selected from the group consisting of niobium nitride and niobium carbide, the mixture having carbon and nitrogen present in a ratio specified by the formula $NbC_xN_{1-x}$ wherein x is from about 0.05 to about 0.75.

3. A superconductor as set forth in claim 2 having a transition temperature greater than 15°K.

4. A superconducting fiber as set forth in claim 1 having the form of a carbon core surrounded by a solid solution of niobium nitride in niobium carbide.

5. A superconductor as set forth in claim 2 wherein said mixture corresponds to $NbC_xN_{x-x}$ wherein said $x$ is from about 0.10 to about 0.30.

6. A process for the preparation of superconducting transition metal carbonitride wherein the transition metal is selected from the group consisting of titanium, niobium, zirconium, tantalum and hafnium, fibers comprising subjecting a carbon fiber to a temperature from about 1200°C to about 1800°C in the presence of
  1. a gaseous transition metal halide wherein the transition metal is selected from the group consisting of titanium, niobium, zirconium, tantalum and hafnium;
  2. nitrogen, and
  3. hydrogen; for a time of from about 10 to about 20 minutes.

7. A process as set forth in claim 6 wherein said temperature is from about 1300°C to about 1800°C.

8. A process as set forth in claim 7 wherein said transition metal halide is selected from the group consisting of titanium tetrachloride, niobium pentachloride, zirconium tetrachloride, tantalum pentachloride, and hafnium tetrachloride.

9. A process as set forth in claim 6 wherein said transition metal halide is niobium pentachloride, and said temperature is from about 1300°C to about 1600°C.

* * * * *